(12) United States Patent
Luere et al.

(10) Patent No.: US 9,947,517 B1
(45) Date of Patent: Apr. 17, 2018

(54) ADJUSTABLE EXTENDED ELECTRODE FOR EDGE UNIFORMITY CONTROL

(71) Applicant: Applied Materials, Inc., Santa Clara, CA (US)

(72) Inventors: Olivier Luere, Sunnyvale, CA (US); Leonid Dorf, San Jose, CA (US); Rajinder Dhindsa, Pleasanton, CA (US); Sunil Srinivasan, Milpitas, CA (US); Denis M. Koosau, Pleasanton, CA (US); James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/382,004

(22) Filed: Dec. 16, 2016

(51) Int. Cl.
*H01J 37/32* (2006.01)

(52) U.S. Cl.
CPC .. *H01J 37/32642* (2013.01); *H01J 37/32082* (2013.01); *H01J 37/32449* (2013.01); *H01J 37/32513* (2013.01); *H01J 37/32522* (2013.01); *H01J 2237/006* (2013.01); *H01J 2237/334* (2013.01)

(58) Field of Classification Search
CPC ......... H01L 21/68735; H01L 21/68742; H01L 21/6875; H01L 21/68771; H01L 21/6719; H01J 37/32715; H01J 37/32091; H01J 37/321; H01J 37/32642; Y10S 156/915; C30B 25/12
USPC ............ 219/121.41, 121.44, 121.43, 121.86, 219/121.52, 121.55; 156/915, 156/345.51–345.55
See application file for complete search history.

(56) References Cited

U.S. PATENT DOCUMENTS

| | | |
|---|---|---|
| 5,660,673 A | 8/1997 | Miyoshi |
| 5,762,714 A | 6/1998 | Mohn et al. |
| 6,022,809 A | 2/2000 | Fan |
| 6,044,534 A | 4/2000 | Seo et al. |
| 6,206,976 B1 | 3/2001 | Crevasse et al. |
| 6,511,543 B1 | 1/2003 | Stauss et al. |
| 6,589,352 B1 | 7/2003 | Yudovsky et al. |
| 6,709,547 B1 | 3/2004 | Ni et al. |

(Continued)

FOREIGN PATENT DOCUMENTS

| | | |
|---|---|---|
| CN | 105336561 A | 2/2016 |
| CN | 105789010 A | 7/2016 |

*Primary Examiner* — Haissa Philogene
(74) *Attorney, Agent, or Firm* — Patterson + Sheridan, LLP

(57) ABSTRACT

Embodiments described herein generally related to a substrate processing apparatus. In one embodiment, a process kit for a substrate processing chamber disclosed herein. The process kit includes a first ring having a top surface and a bottom surface, an adjustable tuning ring having a top surface and a bottom surface, and an actuating mechanism. The bottom surface is supported by a substrate support member. The bottom surface at least partially extends beneath a substrate supported by the substrate support member. The adjustable tuning ring is positioned beneath the first ring. The top surface of the adjustable tuning ring and the first ring define an adjustable gap. The actuating mechanism is interfaced with the bottom surface of the adjustable tuning ring. The actuating mechanism is configured to alter the adjustable gap defined between the bottom surface of the first ring and the top surface of the adjustable tuning ring.

20 Claims, 5 Drawing Sheets

(56) References Cited

U.S. PATENT DOCUMENTS

| | | | |
|---|---|---|---|
| 6,744,212 B2 | 6/2004 | Fischer et al. | |
| 6,896,765 B2 | 5/2005 | Steger | |
| 6,898,558 B2 | 5/2005 | Klekotka | |
| 7,138,067 B2 | 11/2006 | Vahedi et al. | |
| 7,176,403 B2 * | 2/2007 | Steger | H01J 37/32623 156/345.23 |
| 7,252,738 B2 * | 8/2007 | Tong | H01J 37/32623 118/715 |
| 7,968,469 B2 | 6/2011 | Collins et al. | |
| 8,441,640 B2 * | 5/2013 | Patalay | C30B 25/12 117/203 |
| 8,696,878 B2 * | 4/2014 | Riker | C23C 14/34 118/504 |
| 8,900,398 B2 * | 12/2014 | Dhindsa | H01J 37/32642 118/715 |
| 8,999,106 B2 | 4/2015 | Liu et al. | |
| 9,011,637 B2 | 4/2015 | Yamamoto | |
| 9,076,636 B2 | 7/2015 | Ohata et al. | |
| 9,142,391 B2 | 9/2015 | Yamamoto | |
| 2003/0201069 A1 | 10/2003 | Johnson | |
| 2004/0053428 A1 | 3/2004 | Steger | |
| 2004/0149389 A1 | 8/2004 | Fink | |
| 2005/0263070 A1 * | 12/2005 | Fink | H01J 37/32623 118/715 |
| 2008/0236749 A1 | 10/2008 | Koshimizu et al. | |
| 2008/0289766 A1 | 11/2008 | Heemstra et al. | |
| 2009/0067954 A1 | 3/2009 | Lanee et al. | |
| 2011/0157760 A1 | 6/2011 | Willwerth et al. | |
| 2011/0287631 A1 | 11/2011 | Yamamoto | |
| 2012/0305184 A1 | 12/2012 | Singh et al. | |
| 2013/0106286 A1 | 5/2013 | Banna et al. | |
| 2013/0155568 A1 | 6/2013 | Todorow et al. | |
| 2014/0213055 A1 | 7/2014 | Himori et al. | |
| 2015/0064809 A1 | 3/2015 | Lubomirsky | |
| 2015/0181684 A1 | 6/2015 | Banna et al. | |
| 2015/0200124 A1 | 7/2015 | Yamamoto | |
| 2015/0332951 A1 | 11/2015 | Male et al. | |
| 2016/0211165 A1 | 7/2016 | McChesney et al. | |
| 2016/0211166 A1 | 7/2016 | Yan et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 | 4/2017 | Genetti et al. | |
| 2017/0133283 A1 | 5/2017 | Kenworthy | |
| 2017/0213758 A1 * | 7/2017 | Rice | H01L 21/68735 |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0278679 A1 * | 9/2017 | Angelov | H01J 37/321 |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |

* cited by examiner

ADJUSTABLE EXTENDED ELECTRODE FOR EDGE UNIFORMITY CONTROL

BACKGROUND

Field

Embodiments described herein generally relate to a substrate processing apparatus, and more specifically to an improved process kit for a substrate processing apparatus.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, RF power, and the like. Typically, in etch processes, silicon substrates are etched while electrostatically clamped to an electrostatic chuck.

During processing, a substrate resting on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. These non-uniformities at the perimeter may be attributable to electric field termination affects and are sometimes referred to as edge effects. During deposition or etching, a process kit containing at least a deposition ring is sometimes provided to favorably influence uniformity at the substrate perimeter or edge.

Accordingly, there is a continual need for an improved process kit for a substrate processing apparatus.

SUMMARY

Embodiments described herein generally related to a substrate processing apparatus. In one embodiment, a process kit for a substrate processing chamber disclosed herein. The process kit includes a first ring, an adjustable tuning ring, and an actuating mechanism. The first ring has a top surface and a bottom surface. The bottom surface is supported by a substrate support member. The bottom surface at least partially extends beneath a substrate supported by the substrate support member. The adjustable tuning ring is positioned beneath the first ring. The adjustable tuning ring has a top surface and a bottom surface. The top surface of the adjustable tuning ring and the first ring define an adjustable gap. The actuating mechanism is interfaced with the bottom surface of the adjustable tuning ring. The actuating mechanism is configured to alter the adjustable gap defined between the bottom surface of the first ring and the top surface of the adjustable tuning ring.

In another embodiment, a processing chamber is disclosed herein. The processing chamber includes a substrate support member and a process kit. The substrate support member is configured to support a substrate. The process kit is supported by the substrate support member. The process kit includes a first ring, an adjustable tuning ring, and an actuating mechanism. The first ring has a top surface and a bottom surface. The bottom surface is supported by the substrate support member. The bottom surface at least partially extends beneath a substrate supported by the substrate support member. The adjustable tuning ring is positioned beneath the first ring. The adjustable tuning ring has a top surface and a bottom surface. The top surface of the adjustable tuning ring and the first ring define an adjustable gap. The actuating mechanism is interfaced with the bottom surface of the adjustable tuning ring. The actuating mechanism is configured to alter the adjustable gap defined between the bottom surface of the first ring and the top surface of the adjustable tuning ring.

In another embodiment, a method of processing a substrate is disclosed herein. The substrate is positioned on a substrate support member disposed in a substrate processing chamber. A plasma is created above a substrate. A spacing between an adjustable tuning ring and an edge ring is adjusted by actuating the adjustable tuning ring to change the direction of the plasma ions at an edge of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
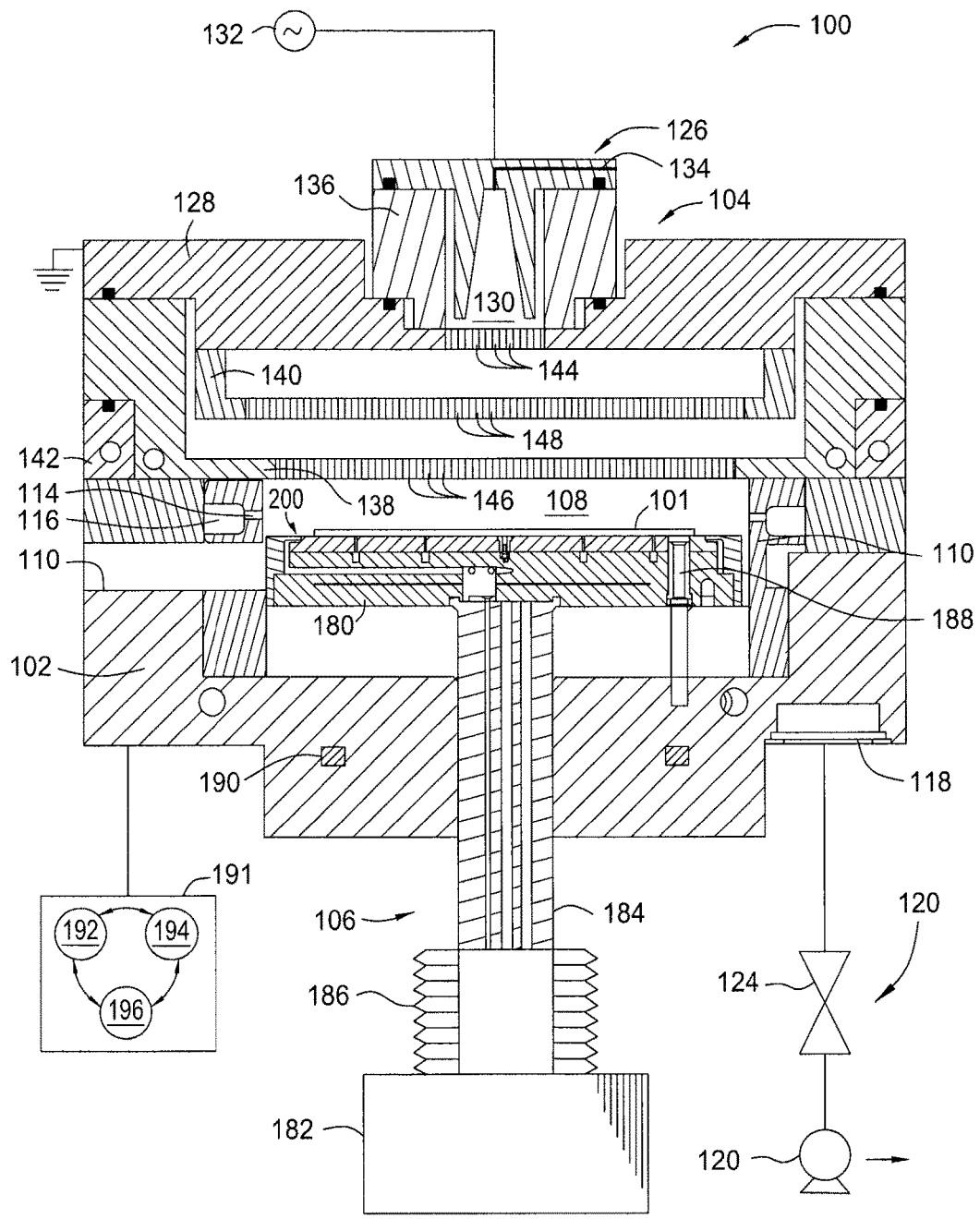
FIG. 1 is a cross sectional view of a processing chamber, according to one embodiment.

FIG. 1 is a cross sectional view of a processing chamber 100 having an adjustable tuning ring 150, according to one embodiment. As shown, the processing chamber 100 is an etch chamber suitable for etching a substrate, such as substrate 101. Examples of processing chambers that may be adapted to benefit from the disclosure are Sym3® Processing Chamber, C3® Processing Chamber, and Mesa™ Processing Chamber, commercially available from Applied Materials, Inc., located in Santa Clara, Calif. It is contemplated that other processing chamber, including deposition chambers and those from other manufacturers, may be adapted to benefit from the disclosure.

The processing chamber 100 may be used for various plasma processes. In one embodiment, the processing chamber 100 may be used to perform dry etching with one or more etching agents. For example, the processing chamber may be used for ignition of plasma from a precursor CxFy (where x and y can be different allowed combinations), O2, NF3, or combinations thereof.

The processing chamber 100 includes a chamber body 102, a lid assembly 104, and a support assembly 106. The lid assembly 104 is positioned at an upper end of the chamber body 102. The support assembly 106 is disclosed in an interior volume 108, defined by the chamber body 102. The chamber body 102 includes a slit valve opening 110 formed in a sidewall thereof. The slit valve opening 110 is selectively opened and closed to allow access to the interior volume 108 by a substrate handling robot (not shown).

The chamber body 102 may further include a liner 112 that surrounds the support assembly 106. The liner 112 is removable for servicing and cleaning. The liner 112 may be made of a metal such as aluminum, a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the chamber 100 to vacuum port 118.

A vacuum system 120 is coupled to the vacuum port 118. The vacuum system 120 may include a vacuum pump 122 and a throttle valve 124. The throttle valve 124 regulates the flow of gases through the chamber 100. The vacuum pump 122 is coupled to the vacuum port 118 disposed in the interior volume 108.

The lid assembly 104 includes at least two stacked components configured to form a plasma volume or cavity therebetween. In one or more embodiments, the lid assembly 104 includes a first electrode 126 ("upper electrode") disposed vertically above a second electrode 128 ("lower electrode"). The upper electrode 126 and the lower electrode 128 confine a plasma cavity 130, therebetween. The first electrode 126 is coupled to a power source 132, such as an RF power supply. The second electrode 128 is connected to ground, forming a capacitance between the two electrodes 126, 128. The upper electrode 126 is in fluid communication with a gas inlet 134. The first end of the one or more gas inlets 134 opens into the plasma cavity 130.

The lid assembly 104 may also include an isolator ring 136 that electrically isolates the first electrode 126 from the second electrode 128. The isolator ring 136 may be made from aluminum oxide or any other insulative, processing compatible, material.

The lid assembly may also include a gas distribution plate 138 and a blocker plate 140. The second electrode 128, the gas distribution plate 138, and the blocker plate 140 may be stacked and disposed on a lid rim 142, which is coupled to the chamber body 102.

In one or more embodiments, the second electrode 128 may include a plurality of gas passages 144 formed beneath the plasma cavity 130 to allow gas from the plasma cavity 130 to flow therethrough. The gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180. The support member 180 is configured to support the substrate 101 for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. Additionally, one or more lift pins 188 may be disposed through the support member 180. The one or more lift pins 188 are configured to extend through the support member 180 such that the substrate 101 may be raised off the surface of the support member 180. The one or more lift pins 188 may be active by a lift ring 190.

Figure 2A:
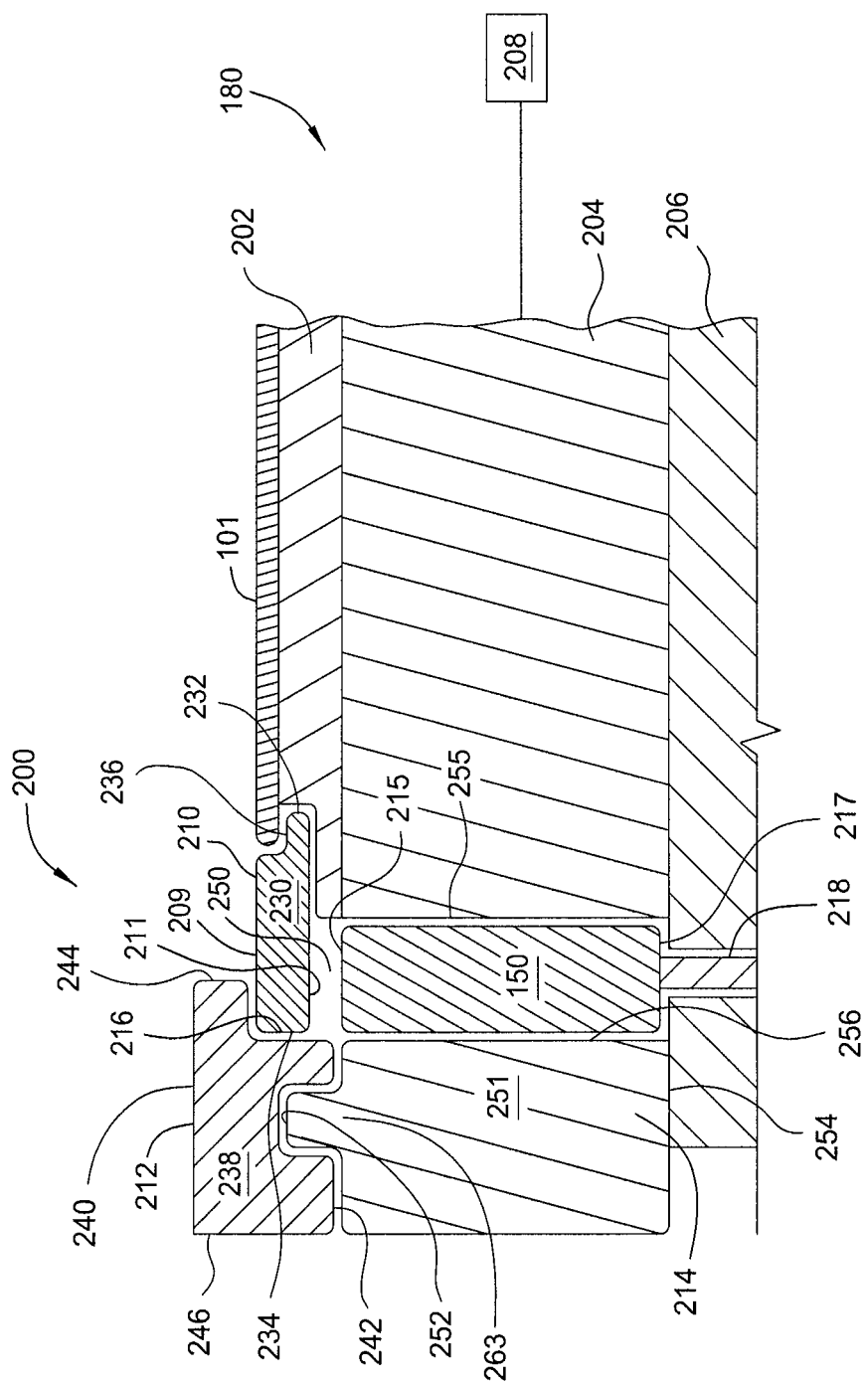
FIG. 2A is enlarged partial cross sectional view of the processing chamber of FIG. 1, according to one embodiment.

FIG. 2A is a partial cross sectional view of a portion of the processing chamber 100, illustrating a process kit 200 disposed therein on a support member 180, according to one embodiment. The support member 180 includes an electrostatic chuck 202, a cooling plate (or cathode) 204, and a base 206. The cooling plate 204 is disposed on the base 206. The cooling plate 204 may include a plurality of cooling channels (not shown) for circulating coolant therethrough. The cooling plate 204 may be engaged with the electrostatic chuck 202 by an adhesive or any suitable mechanism. One or more power supplies 208 may be coupled to the cooling plate 204. The electrostatic chuck 202 may include one or more heaters (not shown). The one or more heaters may be independently controllable. The one or more heaters enable the electrostatic chuck 202 to heat the substrate 101 from a bottom surface of the substrate 101 to a desired temperature.

The process kit 200 may be supported on the support member 180. The process kit 200 includes an edge ring 210 having an annular body 230. The body 230 includes a top surface 209, a bottom surface 211, and inner edge 232, and an outer edge 234. The top surface 209 is substantially parallel to the bottom surface 211. The inner edge 232 is substantially parallel to the outer edge 234, and substantially perpendicular to the bottom surface 211. The body 230 further includes a stepped surface 236 defined therein. The stepped surface 236 is formed in the inner edge 232, such that the stepped surface 236 is substantially parallel to the bottom surface 211. The stepped surface 236 defines a recess for receiving a substrate (e.g., substrate 101). The edge ring 210 is adapted to cover an outer perimeter of the support member 180 and protect the support member 180 from deposition.

The process kit 200 may further include a cover ring 212 and a quartz ring 214. The cover ring 212 includes an annular body 238 having a top surface 240, bottom surface 242, inner edge 244, and outer edge 246. The top surface 240 is substantially parallel to the bottom surface 242. The inner edge 244 is substantially parallel to the outer edge 246, and substantially perpendicular to the bottom surface 242. In the embodiment shown in FIG. 2A, a notch 248 is formed in the bottom surface 242 of the body 238. The quartz ring 214 is disposed adjacent the support member 180. The quartz ring 214 includes an annular body 251 having a top surface 252, bottom surface 254, inner edge 256, and outer edge 258. The quartz ring 214 is configured to support the cover ring 212 in the processing chamber 100. For example, in the embodiment shown, the quartz ring 214 supports the cover ring 212 from the bottom surface 242 of the cover ring 212. In some embodiments, the quartz ring 214 may include a protruding member 263. The protruding member 263 protrudes from the top surface 252 of the quartz ring. The protruding member 263 is configured to mate with the notch 248 formed in the bottom surface 242 of the cover ring 212. The cover ring 212 is positioned along an outside perimeter 216 of the edge ring 210. The edge ring 210 is configured to block particles from slipping beneath the edge ring 210.

The process kit 200 further includes an adjustable tuning ring 150 having a top surface 215 and a bottom surface 217. The adjustable tuning ring 150 may be formed from a conductive material, such as aluminum. The adjustable tuning ring 150 is disposed beneath the edge ring 210, between the quartz ring 214 and the support member 180, forming a gap 250. For example, in one embodiment, the adjustable tuning ring 150 extends down past the electrostatic chuck 202, alongside the cooling plate 204. In one embodiment, the adjustable tuning ring 150 has a height that extends all the way to the bottom of the cooling plate 204. As such, the adjustable tuning ring 150 is able to couple power from the cooling plate 204 to the edge ring 210. The adjustable tuning ring 150 may circumscribe the cooling plate 204, thus forming a laterally spaced gap 255. In one example, the laterally spaced gap is greater than 0 inches and less than or equal to 0.03 inches. The adjustable tuning ring 150 interfaces with a lift pin 218. For example, the lift pin 218 may be operably coupled with the adjustable tuning ring 150. The lift pin 218 is driven by the lift mechanism 183. In some embodiments, the lift pin 218 may be driven by a lift mechanism (not shown) independent form the lift mechanism 183. The lift mechanism 183 allows the adjustable tuning ring 150 to be moved vertically within the chamber 100. In one embodiment, the adjustable tuning ring may be moved between greater than 0 mm and less than or equal to 4 mm vertically, for example, between 2-4 mm. Moving the tuning ring 150 vertically changes the RF power coupling with the edge ring. In one embodiment, the adjustable tuning ring 150 may include a coating 281 formed on the top surface 215 of the adjustable tuning ring 150. For example, the coating 281 may be a yttria oxide coating or a gel-like coating. The coating 281 is used to limit the chemical reaction between the plasma and the adjustable tuning ring 150 and thus limits particle creation and ring damage. In another embodiment, one or more dielectric pads (e.g., Teflon pads) 289 are positioned in between the edge ring 210 and the electrostatic chuck, on which the edge ring 210 sits. The one or more dielectric pads 289 create a gap between the edge ring 210 and the electrostatic chuck in order to decrease the capacitance 302 so that the power coupled from the cathode to the ring 210 is minimized.

Figure 2B:
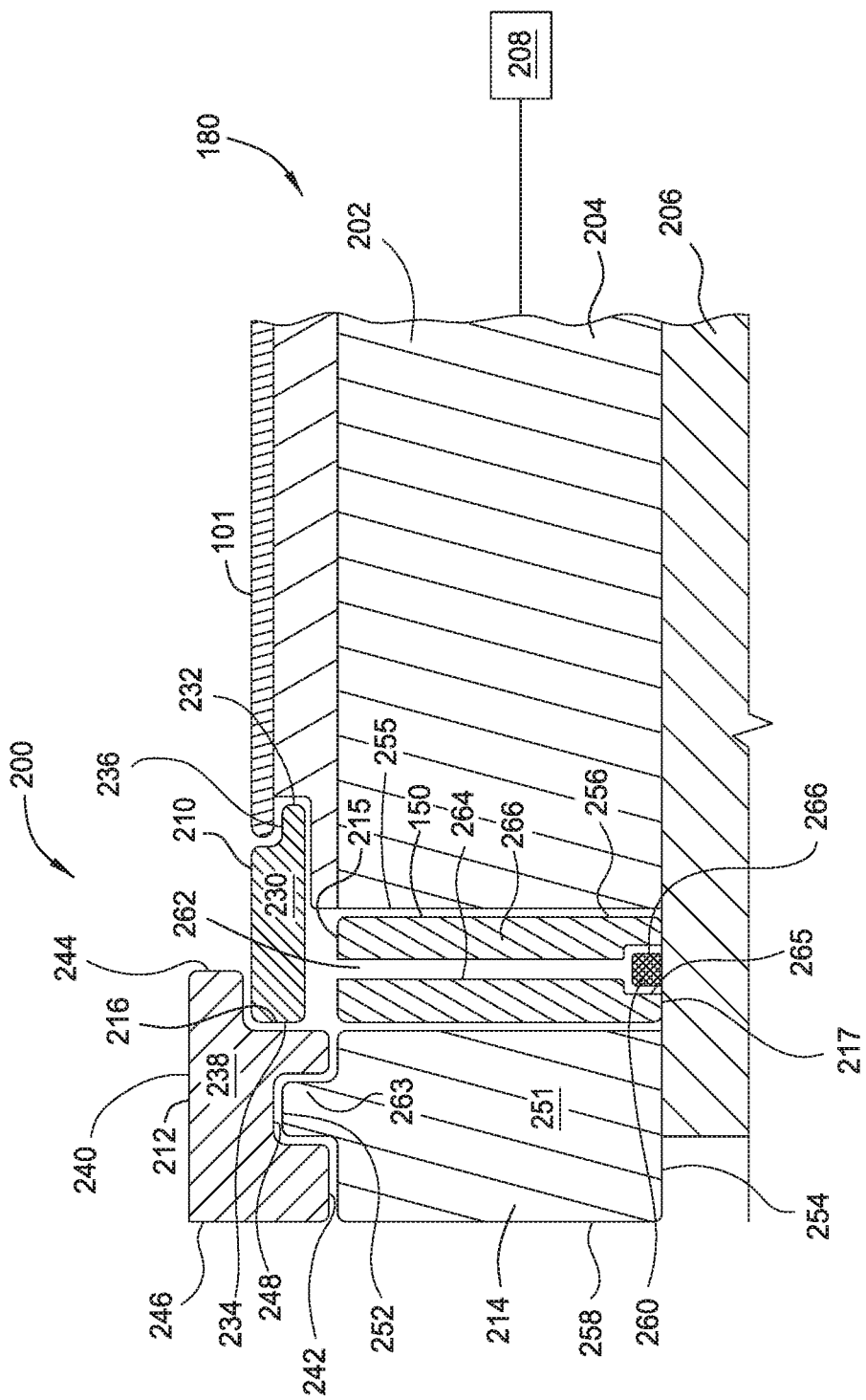
FIG. 2B is enlarged partial cross sectional view of the processing chamber of FIG. 1, according to one embodiment.

In another embodiment, such as that shown in FIG. 2B, the adjustable tuning ring 150 may be moved manually, thus eliminating the need for the lift pin 218. The tuning ring 150 may include a cavity 260 and an access orifice formed therein. The access orifice 262 is formed from a top of the adjustable tuning ring 150, and extends down into the cavity 260. The access orifice 262 has a first diameter 264 that is smaller than a second diameter 265 of the cavity 260. The cavity 260 is formed beneath the access orifice 262. The cavity 260 is formed down to a bottom of the tuning ring 150. The cavity 260 is configured to house a screw 266. The screw 266 may be turned via a hex key (not shown), for example, extending into the cavity 260 via the access orifice 262 such that the screw 266 can raise/lower the tuning ring 150.

Figure 3:
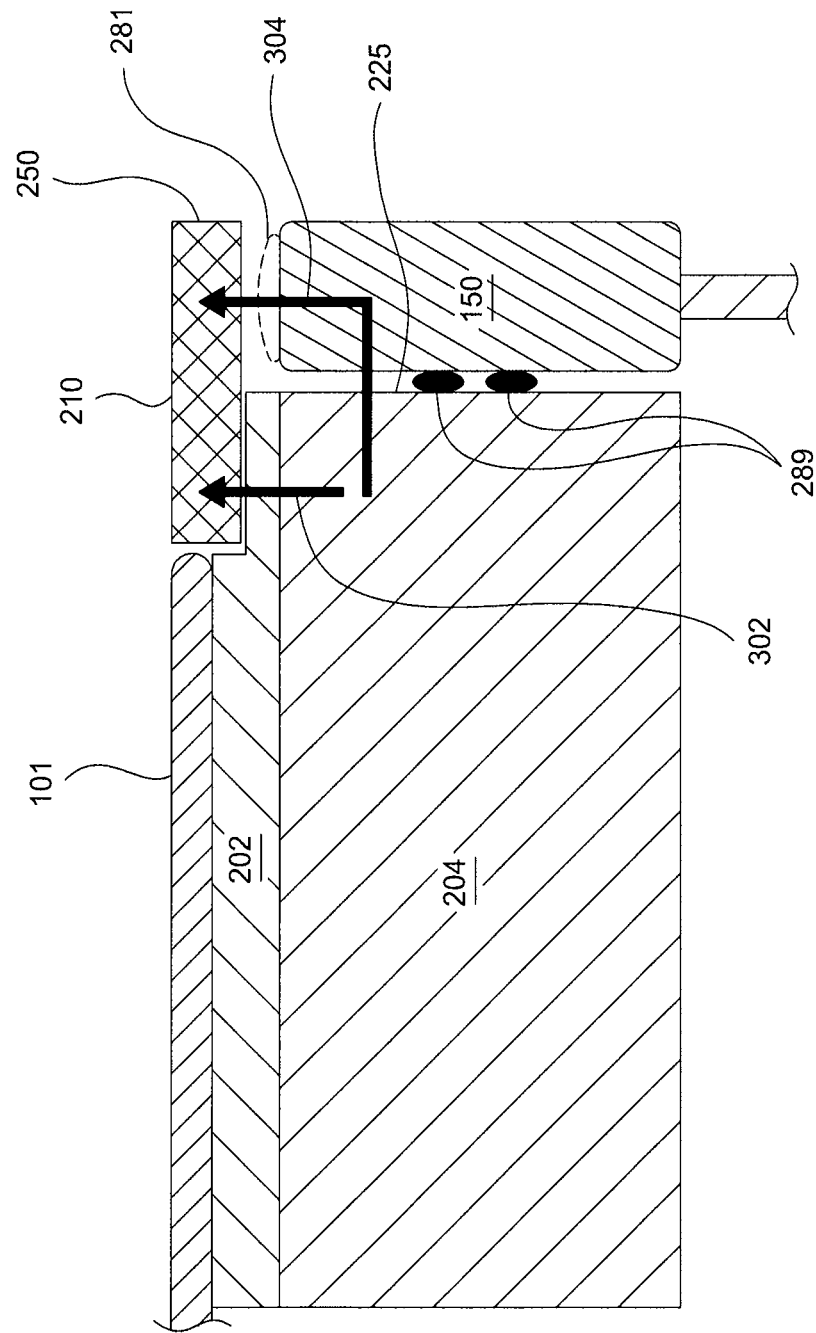
FIG. 3 is a simplified cross sectional view of a portion of the processing chamber of FIG. 1 depicting two capacitance paths, according to one embodiment.

FIG. 3 is a simplified cross sectional view of a portion of the processing chamber of FIG. 1 depicting two capacitances, according to one embodiment. Power may be coupled from the cathode 204 to the edge ring 210 along two paths through two capacitances 302, 304. The amount of power coupled depends on the capacitance along these two paths. The capacitance 302 is fixed. The capacitance 304 may be varied. For example, the capacitance 304 can be tuned by moving the adjustable tuning ring 150 under the edge ring 210 in the vertical direction, thus modifying a gap 250 formed therebetween. Controlling the gap 250 between the adjustable tuning ring 150 and the edge ring 210 controls the capacitance therebetween. Mathematical, capacitance can be represented as $$C = \varepsilon \cdot \varepsilon_0 \cdot \frac{\text{Area}}{\text{Gap}}$$

where $\in$ represents the dielectric constant of the material between the two electrodes (1 for air in the case for the gap 250), $\in_0$ represents the dielectric constant of free space, area represents the area of the adjustable tuning ring 150, and the gap represents the gap 250. As shown, as the gap decreases, the value for $$\frac{\text{Area}}{\text{Gap}}$$

increases, which leads to an increase of the overall capacitance C. As the gap increases, i.e., as the adjustable tuning sleeve is moved farther away from the edge ring 210, the value for $$\frac{\text{Area}}{\text{Gap}}$$

decrease, which decreases the overall capacitance C. As such, controlling the gap value alters the capacitance between the edge ring 210 and the cathode 204. A change in the capacitance changes the power coupled between the edge ring 210 and the cathode 204 and therefore the voltage that is applied to the edge ring 210. For example, as the capacitance increases from a decrease in the gap 250, the voltage applied to the edge ring 210 increases. Controlling the voltage applied to the edge ring 210 allows for control of a plasma sheath about the substrate 101 and the edge ring 210. The effect of which, is discussed in more detail below in conjunction with FIG. 4.

Figure 4:
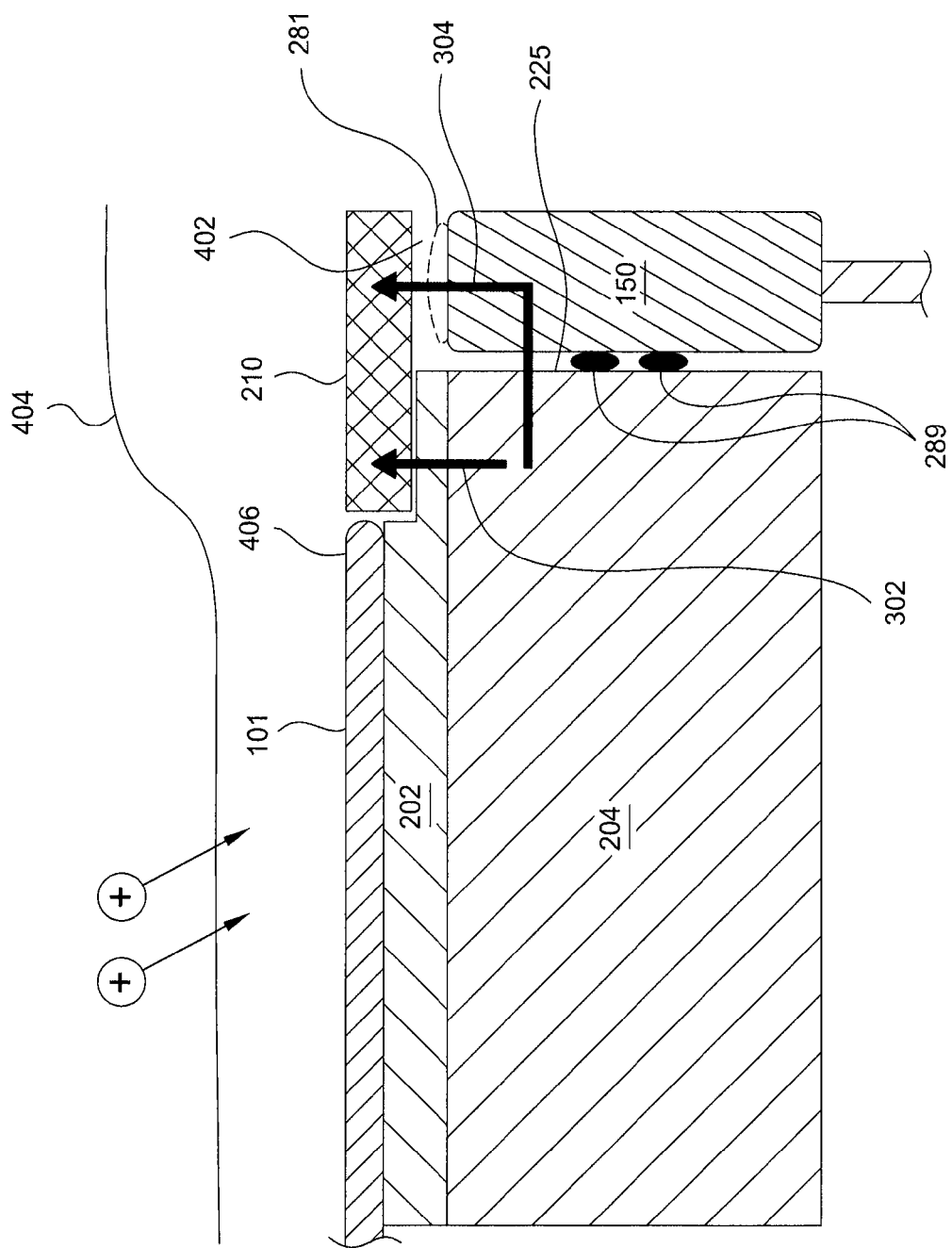
FIG. 4 is a simplified cross sectional view of a portion of the processing chamber of FIG. 1, according to one embodiment, illustrating another advantage of the present disclosure.

FIG. 4 illustrates a portion of the processing chamber 100, according to one embodiment, illustrating another advantage of the present disclosure. Adjusting a vertical gap 402 between the adjustable tuning ring 150 and the edge ring 210 increases/decreases the voltage applied to the edge ring 210. The voltage can be used to control plasma sheath 404 profile at an edge 406 of the substrate 101 to compensate for critical dimension uniformity at the substrate edge 406. The plasma sheath 404 is a thin region of strong electric fields formed by space charge that joins the body of the plasma to its material boundary. Mathematically, the sheath thickness, d, is represented by the Child-Langmuir equation:

$$d = \frac{2}{3}\left(\frac{\varepsilon}{i}\right)^{\frac{1}{2}}\left(\frac{2e}{m}\right)^{\frac{1}{4}}(V_p - V_{DC})^{\frac{3}{4}}$$

Where i is the ion current density, $\epsilon$ is the permittivity of vacuum, e is the elementary electric charge, $V_p$ is the plasma potential, and $V_{DC}$ is the DC voltage.

In the case of an etch reactor, a plasma sheath 404 is formed between the plasma and the substrate 101 being etched, the chamber body 102, and every other part of the processing chamber 100 in contact with the plasma. The ions produced in a plasma are accelerated in the plasma sheath and move perpendicular to the plasma sheath. Controlling the $V_{DC}$, i.e., controlling the voltage applied to the edge ring 210, affects the thickness, d, of the sheath 404. For example, as the voltage increases because capacitance decreases, the thickness of the sheath 404 decreases, because the $V_p$-$V_{DC}$ value decreases. Thus, moving the adjustable tuning ring 150 affects the shape of the sheath 404, which in turn controls the direction of plasma ions.

Referring back to FIG. 1, control of the adjustable tuning ring may be controlled by a controller 191. The controller 191 includes programmable central processing unit (CPU) 192 that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Charged species generation, heating, and other processes are generally stored in the memory 194, typically as software routine. The software routine may also be stored and/or executed by a second CPU (not shown) that is remotely located from the processing chamber 100 being controlled by the CPU 192.

The memory 194 is in the form of computer-readable storage media that contains instructions, that when executed by the CPU 192, facilitates the operation of the chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program (s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

While the foregoing is directed to specific embodiments, other and further embodiments may be devised without departing from the basic scope thereof, and the scope thereof is determined by the claims that follow.

What is claimed is:

1. A process kit for a substrate processing chamber, the process kit comprising:
   a first ring having a top surface and a bottom surface, the bottom surface supported by a substrate support member, the bottom surface at least partially extending beneath a substrate supported by the substrate support member;
   an adjustable tuning ring positioned beneath the first ring, the adjustable tuning ring having a top surface and a bottom surface, the top surface of the adjustable tuning ring and the first ring defining an adjustable gap; and
   an actuating mechanism interfaced with the bottom surface of the adjustable tuning ring, the actuating mechanism configured to alter the adjustable gap defined between the bottom surface of the first ring and the top surface of the adjustable tuning ring.

2. The process kit of claim 1, wherein the adjustable tuning ring is formed from a conductive material.

3. The process kit of claim 1, wherein the adjustable gap is adjustable between 0 and 4 mm.

4. The process kit of claim 1, wherein the actuating mechanism comprises:
   a lift pin having a first end and a second end, the first end of the lift pin contacting the bottom surface of the adjustable tuning ring, the second end of the lift pin in communication with a lift mechanism.

5. The process kit of claim 1, wherein the adjustable tuning ring comprises:
   an annular body;
   a cavity formed in the annular body, the cavity formed in the bottom surface of the annular body; and
   an access orifice formed in the annular body, the access orifice extending from the top surface of the adjustable tuning ring into the cavity.

6. The process kit of claim 5, wherein the actuating mechanism is a screw disposed at least partially in the cavity, the screw configured to be rotated through the access orifice to actuate the adjustable tuning ring.

7. The process kit of claim 5, wherein the cavity has a first diameter and the access orifice has a second diameter, the first diameter being larger than the second diameter.

8. The process kit of claim 1, wherein the actuating mechanism is configured to control a thickness of a plasma sheath formed between the plasma and the edge ring.

9. A processing chamber, comprising:
   a substrate support member configured to support a substrate; and
   a process kit supported by the substrate support member, the process kit comprising:
      a first ring having a top surface and a bottom surface, the bottom surface supported by the substrate support member, the bottom surface at least partially extending beneath the substrate supported by the substrate support member;
      an adjustable tuning ring positioned beneath the first ring, the adjustable tuning ring having a top surface and a bottom surface, the top surface of the adjustable tuning ring and the first ring defining an adjustable gap; and
      an actuating mechanism interfaced with the bottom surface of the adjustable tuning ring, the actuating mechanism configured to alter the adjustable gap defined between the bottom surface of the first ring and the top surface of the adjustable tuning ring.

10. The processing chamber of claim 9, wherein the adjustable tuning ring is formed from a conductive material.

11. The processing chamber of claim 9, wherein the adjustable gap is adjustable between 0 and 4 mm.

12. The processing chamber of claim 9, wherein the actuating mechanism comprises:
   a lift pin having a first end and a second end, the first end of the lift pin contacting the bottom surface of the adjustable tuning ring, the second end of the lift pin in communication with a lift mechanism.

13. The processing chamber of claim 9, wherein the adjustable tuning ring comprises:
   an annular body;
   a cavity formed in the annular body, the cavity formed in the bottom surface of the annular body; and
   an access orifice formed in the annular body, the access orifice extending from the top surface of the adjustable tuning ring into the cavity.

14. The processing chamber of claim 13, wherein the actuating mechanism is a screw disposed at least partially in the cavity, the screw configured to be rotated through the access orifice to actuate the adjustable tuning ring.

15. The processing chamber of claim 13, wherein the cavity has a first diameter and the access orifice has a second diameter, the first diameter being larger than the second diameter.

16. The processing chamber of claim 9, wherein the actuating mechanism is configured to control a thickness of a plasma sheath formed between as plasma and the edge ring.

17. The processing chamber of claim 9, wherein the substrate support member comprises:
   a base;
   a cooling plate supported by the base; and
   an electrostatic chuck positioned on a top surface of the cooling plate.

18. The processing chamber of claim 17, wherein the adjustable tuning ring is spaced from the cooling plate between about 0-2 mm.

19. A method of processing a substrate, comprising:
   positioning the substrate on a substrate support member disposed in a substrate processing chamber;
   forming a plasma above the substrate; and
   adjusting a spacing between an adjustable tuning ring and an edge ring by actuating the adjustable tuning ring to change a direction of ions at an edge of the substrate.

20. The method of claim 19, wherein actuating the adjustable tuning ring comprises:
   altering a thickness of a plasma sheath formed between the plasma and the edge ring.

* * * * *